United States Patent
Kim et al.

(10) Patent No.: US 7,528,416 B2
(45) Date of Patent: May 5, 2009

(54) VERTICAL STRUCTURE LED AND FABRICATING METHOD THEREOF

(75) Inventors: Sunjung Kim, Suwon-si (KR); Hyunjae Lee, Yongin-si (KR); Geunho Kim, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 133 days.

(21) Appl. No.: 11/476,627

(22) Filed: Jun. 29, 2006

(65) Prior Publication Data
US 2007/0001190 A1    Jan. 4, 2007

(30) Foreign Application Priority Data
Jul. 4, 2005    (KR) ............... 10-2005-0059910

(51) Int. Cl.
  H01L 27/15    (2006.01)
  H01L 21/00    (2006.01)
(52) U.S. Cl. .................. 257/80; 257/94; 438/26; 438/46
(58) Field of Classification Search ............. 438/22, 438/25, 26, 27, 46, 47; 257/80, 81, 94, 98, 257/99
See application file for complete search history.

(56) References Cited

U.S. PATENT DOCUMENTS

2004/0245543 A1*  12/2004  Yoo ..................... 257/103
2008/0001166 A1*   1/2008  Lee et al. .............. 257/103

* cited by examiner

Primary Examiner—Kevin M Picardat
(74) Attorney, Agent, or Firm—McKenna Long & Aldridge LLP

(57) ABSTRACT

A vertical structure light emitting diode (LED) and a fabricating method thereof is disclosed, wherein a metal support layer is formed on an upper surface of a light emitting structure by way of electrolytic plating method in which no high temperature process is required to obviate occurrence of defects on the devices, and the metal support layer containing a soft metal and a hard metal is formed on the light emitting structure to prevent occurrence of warping of a wafer to increase the mechanical strength and to improve reliability.

18 Claims, 9 Drawing Sheets

VERTICAL STRUCTURE LED AND FABRICATING METHOD THEREOF

This application claims priority to an application filed in the Korean Industrial Property Office on Jul. 4, 2005, and assigned serial No. 10-2005-0059910, the contents of which are incorporated herein by reference.

BACKGROUND OF THE INVENTION

1. Field of the Invention

The present invention relates to a vertical structure light emitting diode (LED) and a fabricating method thereof.

2. Discussion of the Related Art

Recently, $In_xGa_{1-x}N$ used for active layers of light emitting diodes (LEDs) using nitride-based compound semiconductors are known materials capable of light emitting over an entire range of visible rays according to configuration of In because ranges of its energy band gap are broad.

Application area of the LEDs is so wide that they are used for electric bulletin boards, display elements, backlight elements, electric bulbs and the like. Such being the case, the application area is gradually expanded to make it imperative to develop high-graded LEDs.

Figure 1:
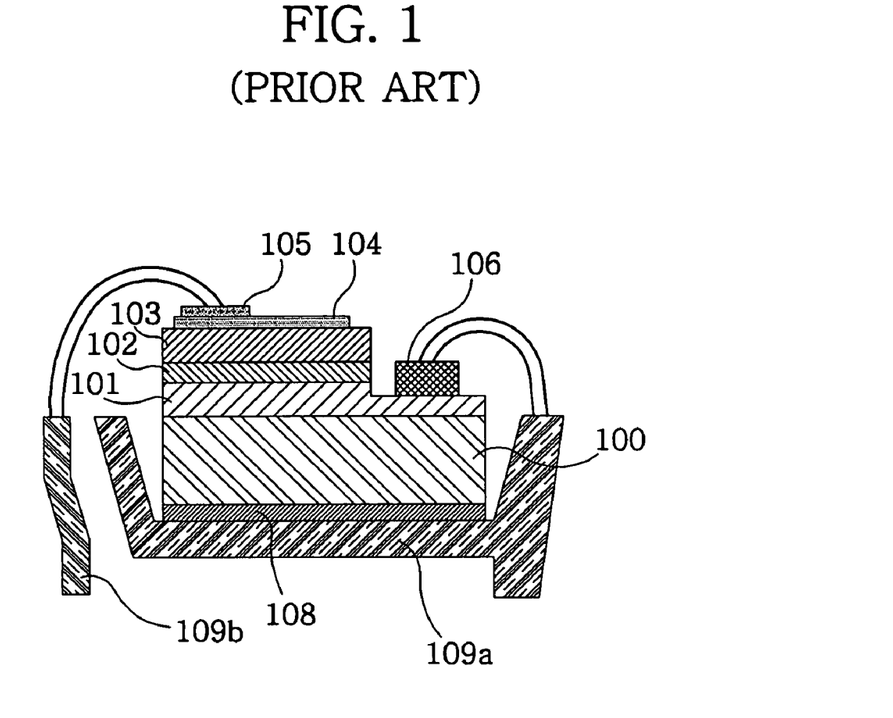
FIG. 1 is a schematic cross-sectional view of a light emitting diode according to the prior art.

FIG. 1 illustrates a schematic cross-sectional view of an LED according to the conventional techniques, where a sapphire substrate 100 is sequentially stacked thereon by N-GaN layer 101, an active layer 102, P-GaN layer 103. Mesa-etching is performed from the P-GaN layer 103 to portions of the N-GaN layer 101. An upper surface of the P-GaN layer 103 is sequentially formed by a transparent electrode 104 and a P-metal layer 105, and an N-metal layer 106 is formed on the mesa-etched N-GaN layer 101.

The LED thus structured is bonded to a molding cup using adhesive 108, and a first lead frame 109a connected to one external lead and the N-metal layer 103 are wire-bonded, and a second lead frame 109a connected to the other external lead and the P-metal layer 105 are wire-bonded for assembly.

Now, operation of the LEDs thus structured will be explained. If a voltage is applied to a N metal layer and a P metal layer, electrons and holes flow into the active layer 102 from the N-GaN layer 101 and the P-GaN layer 103 to generate the re-coupling of electrons and holes and the light emission.

The light emitted from the active layer 102 advances from thereunder and thereabove, and the light advancing from the above the active layer 102 is discharged outside via the P-GaN layer 103, and portions of light advancing above go downward to escape to the outside of the LED chip, and portions of light escape under a sapphire substrate to be absorbed into or reflected from solder employed for assembling the LED chips, and again advance above the active layer. Portions of the light are again absorbed by the active layer or exit to outside via the active layer.

However, because the aforementioned LED, known as a horizontal LED, is manufactured on a sapphire substrate having a low thermal conductivity, it is difficult to discharge the heat generated in the process of device operation, thereby resulting in problems of degraded characteristics of the devices.

Another problem is that portions of the active layer should be removed for formation of electrodes as shown in FIG. 1, which decreases a light emitting region to make it difficult to realize high luminance and high grade of LEDs, results in decreased number of chips on a same wafer and difficulty in fabricating process, and two-time bondings during assembly.

Yet another problem is that if a sapphire is used as substrate during processes of lapping, polishing, scribing and breaking for dicing-out (separation) of a unit chip following completion of process of LED chips on a wafer, device fabrication yield decreases due to hardness of the sapphire material and non-uniformity of cleavage planes with GaN.

FIGS. 2a to 2h are schematic cross-sectional views explaining a fabrication process of a vertical LED, where the fabrication is processed in such a manner that LED structure is stacked on a sapphire substrate 121 using Metal Oxide Chemical Vapor Deposition (MOCVD), and electrodes and reflector films are formed on an upper surface of the P-GaN 125. The wafer 120 is bonded to a separately manufactured support substrate 130 and the sapphire substrate 121 is removed.

Figure 2A:
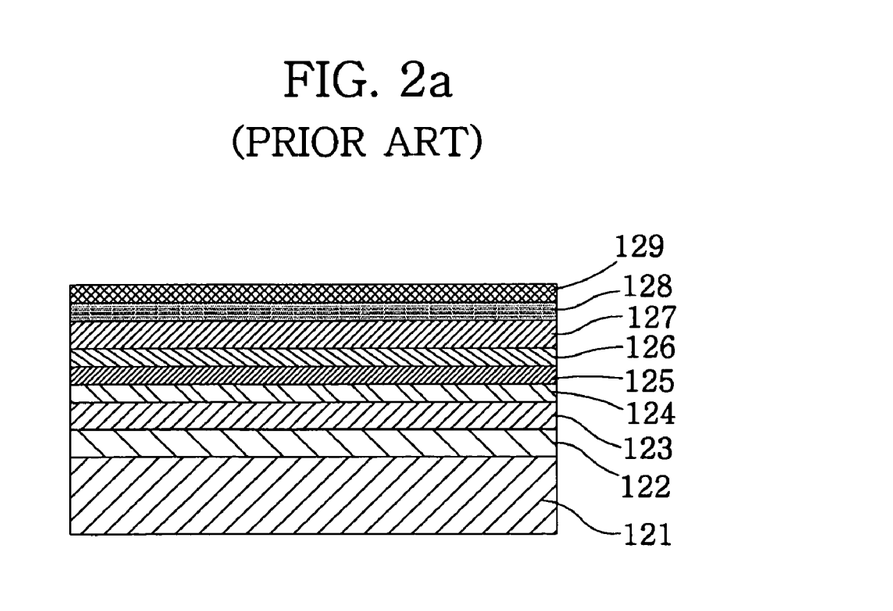
FIGS. 2a through 2h are process drawings of fabricated cross-sections for a vertical LED according to the prior art

First, referring to FIG. 2a, the MOCVD process is performed on the sapphire substrate 121, and an undoped GaN layer 122, a GaN layer 122, an N-GaN layer 123, $In_xGa_{1-x}N$ layer 124 and a P-GaN layer 125 are stacked in sequence.

Successively, the P-GaN layer 125 is sequentially formed at an upper surface thereof with a transparent electrode 126, a reflector film 127, a solder response check layer 128, and a metal layer 129 selected out of any one of Ti/Au, Ni/Au and Pt/Au.

Figure 2B:
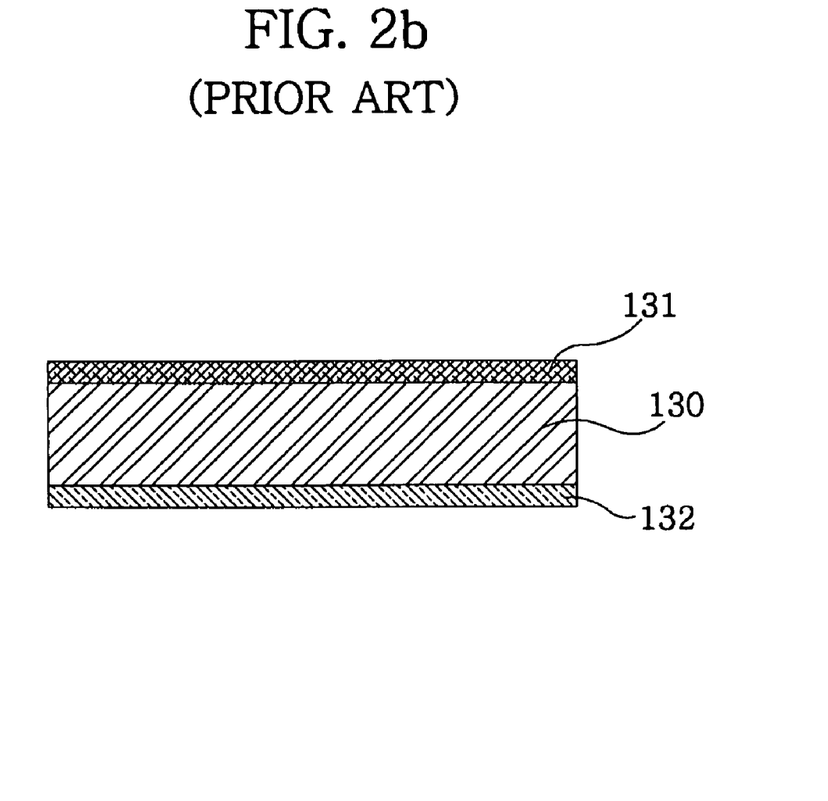

Next, referring to FIG. 2b, first and second ohmic contact metal layers 131 and 132 are respectively formed on the upper and lower surfaces of a base substrate 130 in which electric current can flow.

Figure 2C:
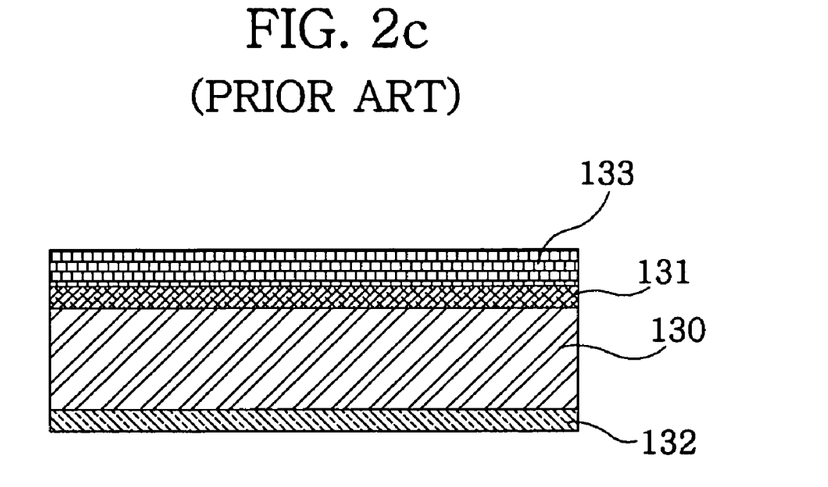

Successively, the first and second ohmic contact metal layers 131 and 132 are formed thereon with LED chip bonding solder 133 (see FIG. 2c).

Figure 2D:
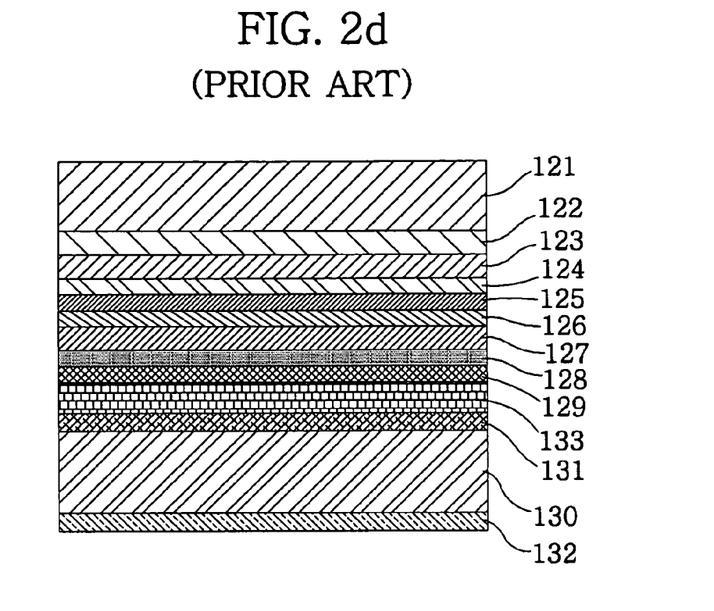

Next, the LED chip bonding solder 133 is bonded thereon to the metal layer 129 and a structure formed on the sapphire substrate 121 is bonded to the base substrate 130 (see FIG. 2d).

Figure 2E:
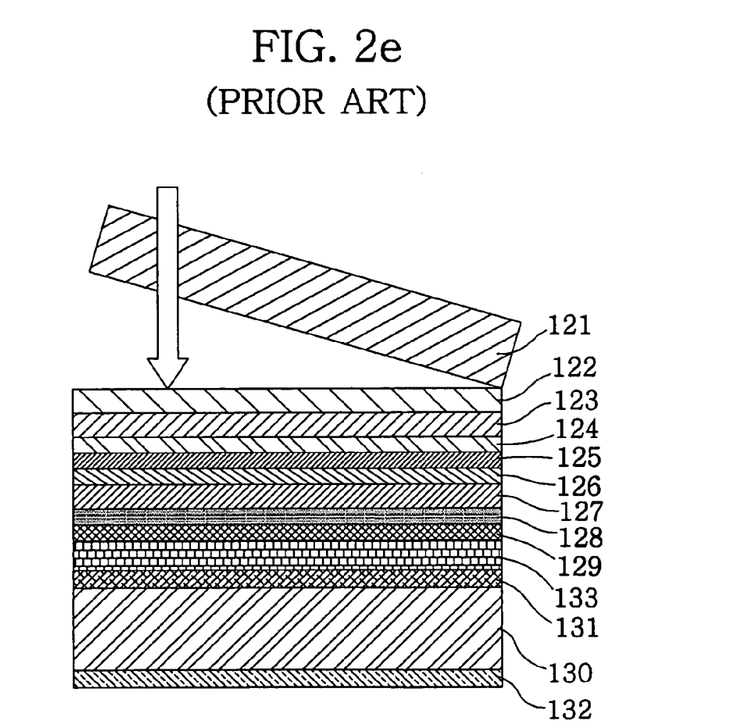
Figure 2F:
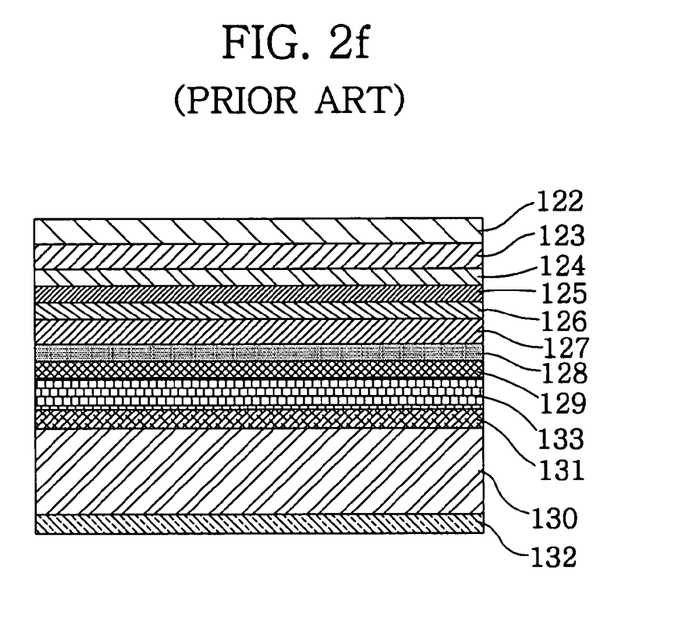

Successively, laser is irradiated on the sapphire substrate 121 to dice out the sapphire substrate 121 from the undoped GaN layer 122 (see FIG. 2e). The undoped GaN layer 122 remains as a damaged layer up to a predetermined thickness by the Laser Lift Off (LLO) process.

Figure 2G:
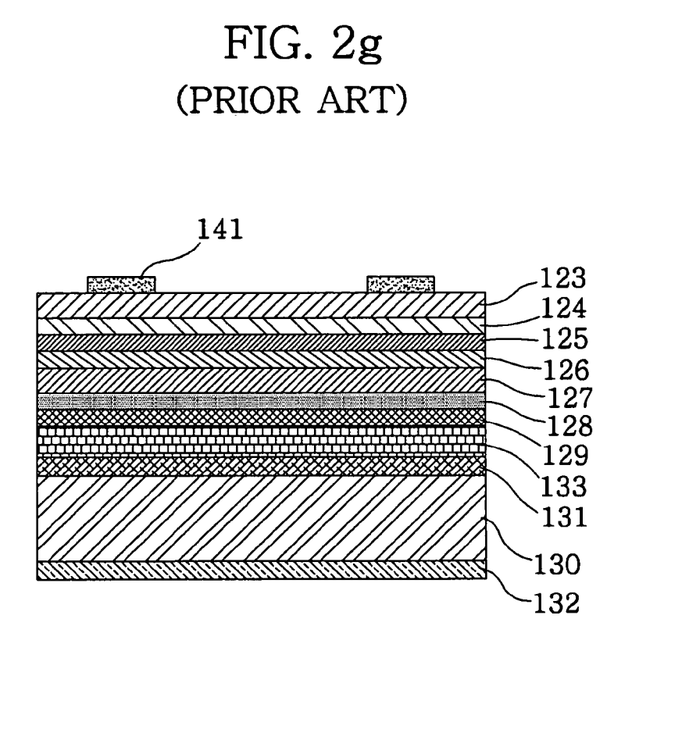
Figure 2H:
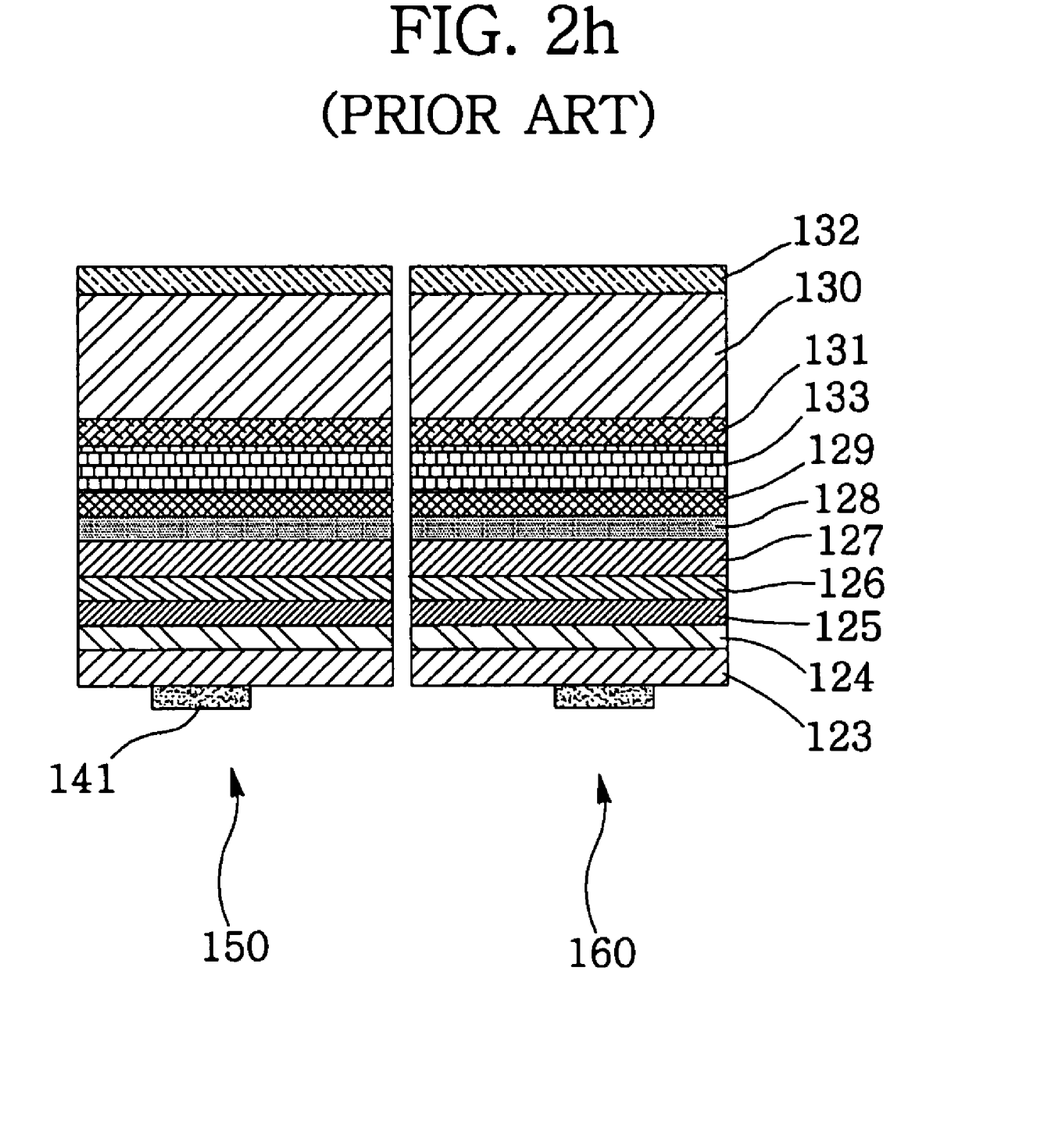

Subsequently, a total etching is performed by using the dry etching process until the N-GaN layer 123 is exposed, and an upper surface of the N-GaN layer 123 corresponding to respective LEDs is formed with an N-electrode pad 141 (see FIG. 2g).

Lastly, cutting processes of scribing and breaking are performed from the second ohmic contact metal layer 132 to the N-GaN layer 123 to dice out into individual devices.

Accordingly, there is an advantage in the LEDs according to the present invention in that it is fabricated in a vertical structure disposed with respective electrodes on the upper and the lower surface thereof, and fabricating process is simplified due to omission of the conventional etching process.

However, the conventional techniques suffer from the following problems. In other words, when the sapphire substrate is separated, a high temperature process is needed because a base substrate for supporting a wafer formed with the LED structure is bonded using solder, such that coefficient of thermal expansion and crystal lattice constant generate stress among different materials, resulting in defects on the LED. As a result, development of a forming process for a support substrate not requiring a condition of the high temperature is much demanded.

SUMMARY OF THE INVENTION

The present invention is disclosed to solve the aforementioned problems and it is an object of the present invention to provide a vertical structure light emitting diode (LED) and a fabricating method thereof that substantially obviates one or more of the aforementioned problems due to limitations and disadvantages of the related art by forming a metal support layer on an upper surface of LED structure by way of electrolytic plating method not requiring a high temperature process, thereby enabling to reduce occurrence of defects on the device.

Another object is to form on an upper surface of a light emitting structure a metal support layer including a soft metal and a hard metal to prevent a warp of a wafer, to increase mechanical strength and to improve reliability.

According to one aspect of the present invention, a vertical structure light emitting diode (LED) comprises: a light emitting structure; and a metal support layer formed on an upper surface of the light emitting structure and comprised with a soft metal and a hard metal having a Young's modulus higher than that of the soft metal.

According to another aspect of the present invention, a fabricating method of a vertical LED comprises: forming a light emitting structure on a substrate; forming a metal support layer on an upper surface of the light emitting structure by way of electrolytic plating process; removing the substrate; and forming an electrode on a lower surface of the light emitting structure.

BRIEF DESCRIPTION OF THE DRAWINGS

The present invention will become more fully understood from the detailed description given hereinbelow for illustration only, and thus the drawings are not limitative of the present invention, and wherein.

DETAILED DESCRIPTION OF THE INVENTION

Next, embodiments of the present invention will be described using the drawings.

Figure 3A:
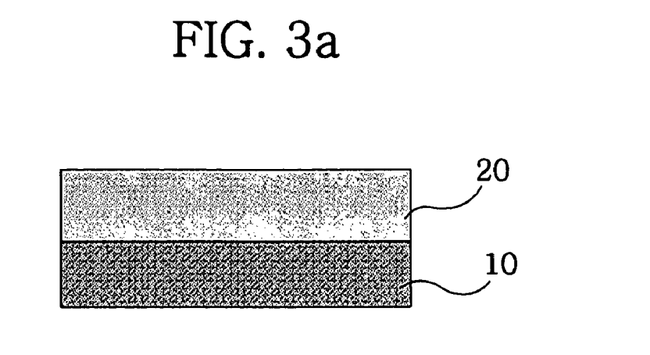
FIGS. 3a through 3d are schematic cross-sectional views illustrating a fabricating process of a vertical LED including a metal support layer according to the present invention.

FIGS. 3a through 3d are schematic cross-sectional views illustrating a fabricating process of a vertical LED including a metal support layer according to the present invention, and as shown in FIG. 3a, a substrate 10 is formed thereon with a light emitting structure 20.

Here, the substrate 10 and the light emitting structure 20 may adopt all the substrates and the light emitting structures of the light emitting diodes (LEDs) known in the technical fields according to the present invention unless specifically limited.

Figure 5:
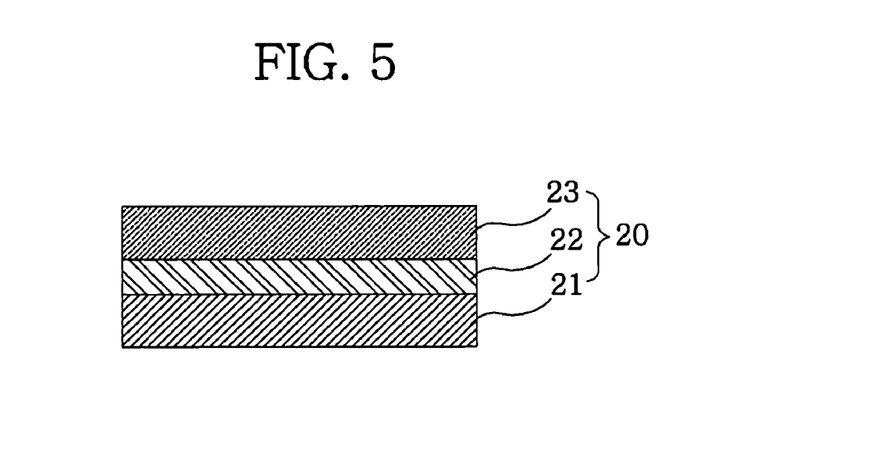
FIG. 5 is a schematic cross-sectional view illustrating a light emitting structure according to the present invention.

Furthermore, the light emitting structure 20 is preferably stacked in sequence with a first semiconductor layer 21 having a first polarity, an active layer 22 and a second semiconductor layer 23 having a reverse polarity from the first polarity, as shown in FIG. 5. At this time, if the first polarity is an N type, the second polarity is a P type.

More preferably, a buffer layer including an undoped U-GaN layer for improving characteristic of an epitaxial layer and for minimizing loss of the epitaxial layer at a substrate removing step is formed at a lower surface of the N-GaN layer.

Figure 3B:
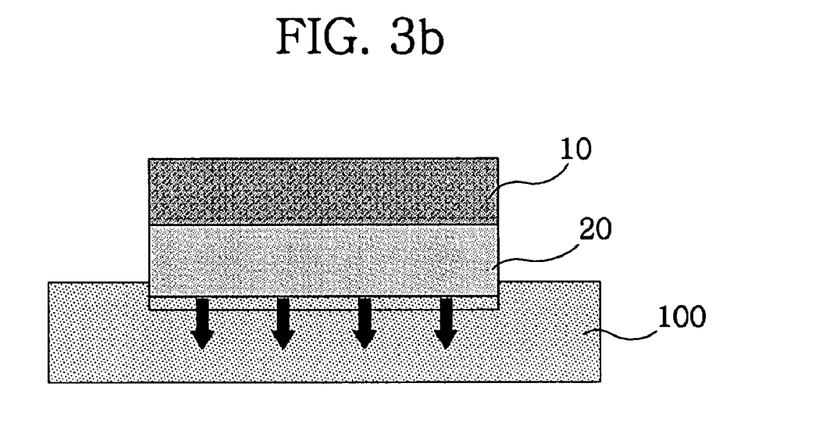
Figure 3C:
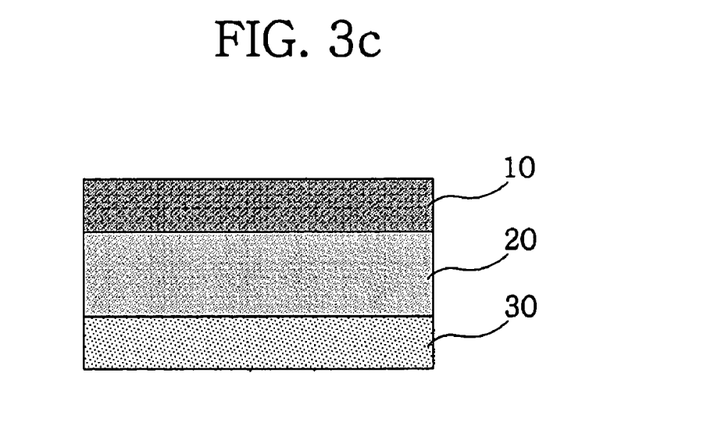
Figure 4:
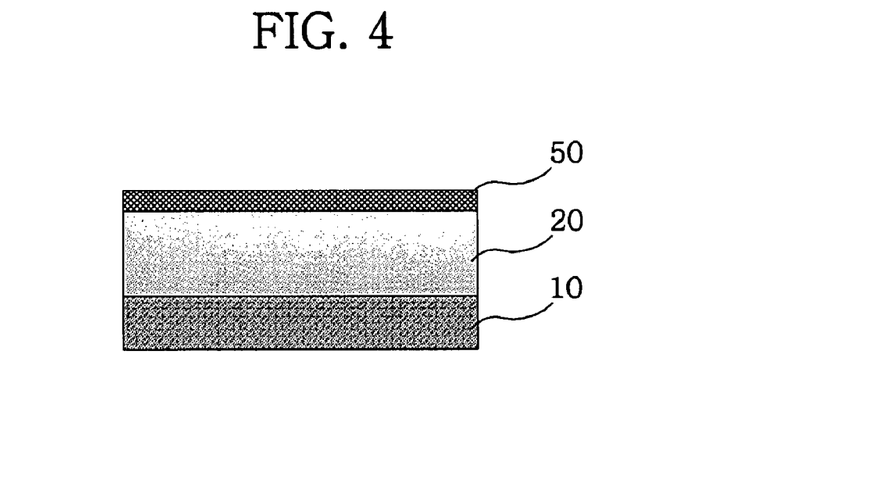
FIG. 4 is a schematic cross-sectional view illustrating a seed layer formed on an upper surface of a light emitting structure for electrolytic plating according to the present invention.

Next, a metal support layer 30 is formed by electrolytic plating method in which an upper side of the light emitting structure 20 is dipped in a plating solution 100 (FIGS. 3b and 3c). Here, the light emitting structure 20 is formed thereon with a seed layer 50 as illustrated in FIG. 4.

In other words, the metal support layer is formed on the light emitting structure by way of electrolytic plating of low temperature process according to the present invention such that coefficient of thermal expansion and grid constant can prevent occurrence of tension among different materials, and the metal support layer can be formed at a front with a good adhesion regardless of the light emitting structure of the LED.

The plating solution 100 may be the one usually employed for the general plating method. Furthermore, the metal support layer 30 may concurrently function as a P-electrode. As a result, a metal having an excellent electrical conductivity is preferred for use for the metal support layer. Furthermore, the metal support layer 30 should be capable of fully distributing the heat that is generated in the course of device operation.

Accordingly, a metal having an excellent electrical conductivity should be used for the metal support layer, and a metal having a thermal conductivity in the range of 150~400 W/km is preferred for the metal support layer. Metals satisfying said conditions may include Au, Cu, Ag and Al.

However, because a metal having an excellent thermal conductivity is a soft metal, there was found the following disadvantage when the metal support layer is formed with a soft metal.

In other words, if plating conditions are not properly controlled, stress may easily occur in the metal itself, and a warp can easily occur on an entire wafer following removal of the substrate, and the warped wafer is not adequate for a post fabrication process.

Still worse, the device is not easily removed in case of using the soft metal such that it is not preferred to form a metal support layer using only a pure soft metal.

Consequently, it is preferable that the metal support layer 30 should have a mechanical strength capable of playing a sufficient supporting role for the entire device and simultaneously satisfy the thermal conductivity.

The present invention provides a metal support layer 30 containing a soft metal having an excellent thermal conductivity and a hard metal having a mechanical stiffness as a preferred embodiment of the metal support layer satisfying the aforementioned conditions.

At this time, the metal support layer 30 is preferably formed with an alloy of a soft metal and a hard metal.

Accordingly, the present invention is configured in such a fashion that a metal support layer comprising a soft metal and a hard metal is formed on the light emitting structure to thereby enable to prevent a warping problem of a wafer and to increase the mechanical stiffness, such that problems occurring in the course of post-process in case of using a soft metal for the metal support layer can be eliminated to improve the reliability of the product.

In other words, if the metal support layer is made of a soft metal, each light emitting device is not easily separated in the separation process following the fabricating process of the devices due to softness of the metal support layer., however, the metal support layer according to the present invention contains a soft metal and a hard metal at the same time to enable to perform a process of smoothly separating the light emitting devices owing to good mechanical strength.

Here, it is preferred that the soft metal is at least one or more of Au, Cu, Ag or Al having a high thermal conductivity.

Furthermore, a hard metal capable of being alloyed with a soft metal is preferred to have the following characteristics: First, it should have a similar crystalline structure as that of a soft metal in order to minimize an occurrence of an inner tension during alloy or surface formation; Second, it should have a Young's modulus higher than that of the soft metal in order to increase a mechanical stiffness or to decrease a brittleness by complementing the softness of the soft metal; Third, it should have a relatively higher melting point than that of the soft metal in order to withstand a heat treatment when the heat treatment is included for the device fabrication following formation of a metal support film.

In other words, performance of plating process using metals having a same crystal lattice constant can only reduce the stress during the alloying. For example, Cu having a crystal structure of a Face Centered Cubic (FCC) crystal lattice is plated with Al, Ag, Ni, Co, Pt or Pd each having the same FCC crystal structure to form an alloy. It is therefore preferred that a soft metal and a hard metal have a same crystal lattice constant.

Furthermore, a metal with a high thermal conductivity is preferred but the thermal conductivity can be complemented to a large extent by changes of alloy structure so that its importance is rather low compared with that of the above-mentioned conditions.

Metals approximating the above condition may include Ni, Co, Pt or Pd, and at least one or more of them may be selected for the metal support layer.

A preferred embodiment of structure for the metal support layer 30 will be described later in detail.

As described above, following the formation of the metal support layer 30, the substrate 10 is removed as shown in FIG. 3c.

Figure 3D:
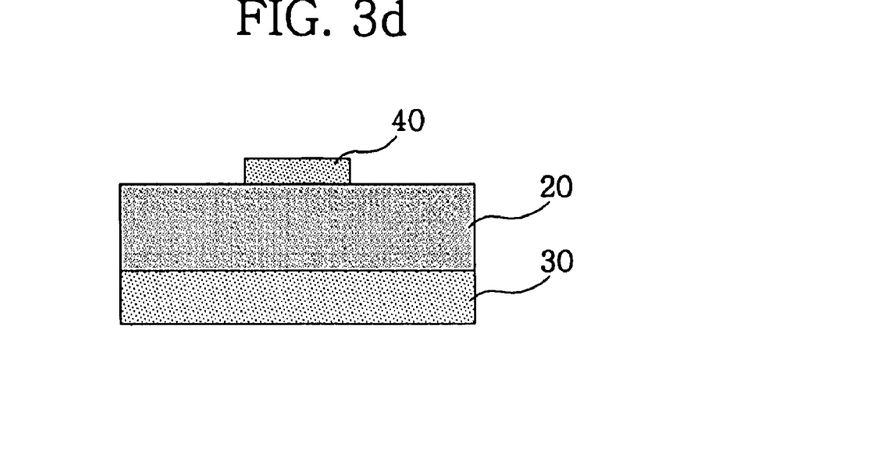

At this time, if the light emitting structure 20 is stacked in sequence with the first semiconductor layer 21 having a first polarity, the active layer 22 and the second semiconductor layer 23 having a reverse polarity from the first polarity, as shown in FIG. 5, the first semiconductor layer 21 is dry etched to a full exposure. Lastly, the light emitting structure 20 is formed thereunder with an electrode 40 (FIG. 3d). At this time, as the first semiconductor layer 21 is formed thereunder with an electrode, if the first semiconductor layer 21 is an N-semiconductor layer, the electrode becomes an N-electrode. By this, the vertical structure LED is completed in fabrication.

The vertical structure LED denotes a structure in which the light emitting structure 20 is formed thereon and thereunder with electrodes, and as depicted in FIG. 3d, the light emitting structure 20 is disposed thereon with an electrode 40 and is formed thereunder with the metal support layer 30.

A method of removing the substrate 10 may be performed by that of the known art. In other words, a laser lift-off (LLO) process may be used to remove the sapphire substrate from the GaN epitaxial layer by applying an excimer laser having wavelength transparent to sapphire, or dry and wet etching methods may be employed.

Figure 6A:
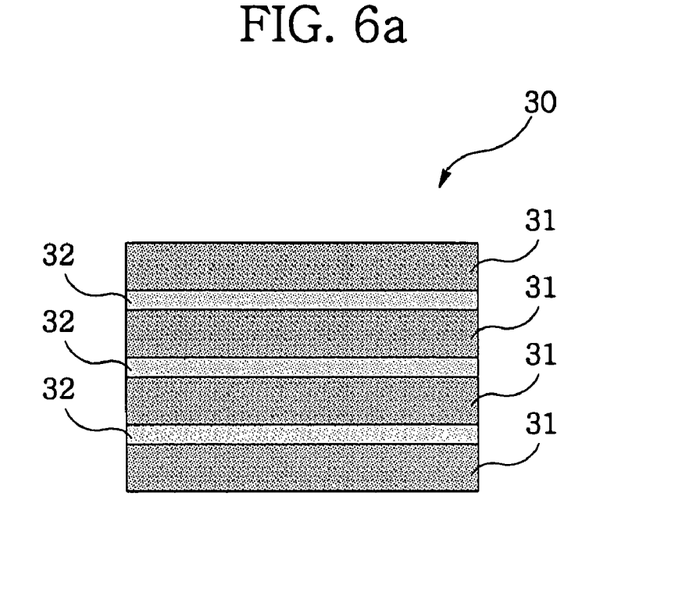
FIGS. 6a and 6b are cross-sectional views illustrating one embodiment of a metal support layer of a vertical LED according to the present invention.
Figure 6B:
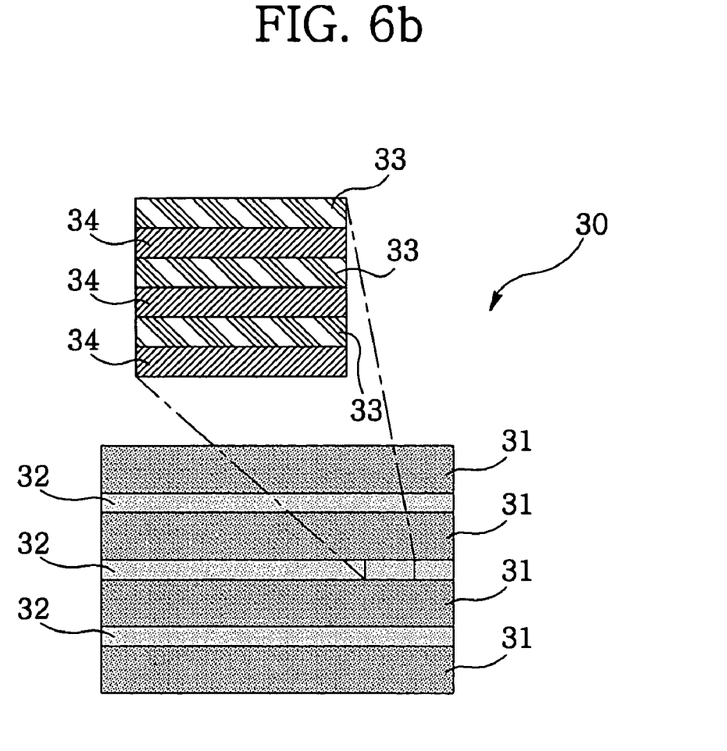

FIGS. 6a and 6b are cross-sectional views illustrating one embodiment of a metal support layer of a vertical LED according to the present invention.

First, FIG. 6a is a cross-sectional view illustrating a structure of a metal support layer 30 formed by a metal alloy in which a soft metal with an excellent thermal conductivity and a hard metal having a good mechanical rigidness are alloyed in the soft metal.

As shown in FIG. 6a, the metal support layer 30 is formed by an alloy layer 32 in which thin soft metal films and hard metals each having a good mechanical strength are mixed in a soft metal 31 in order to reinforce a mechanical stiffness of the soft metal.

In other words, the hard metal in the metal support layer has a Young's modulus higher than that of the soft metal, and exists in the soft metal under an alloyed layer state of being alloyed with the soft metal. The method of forming the alloy layer 32 in which the soft metal and the hard metal having a good mechanical strength are mixed is performed by plating, adjusting current and voltage.

For example, if voltage scanning is performed on a plating solution in which the soft metal and the hard metal are mixed, respectively different current peaks are shown. At this time, if a constant current and a constant voltage are applied to each current peak, desired alloy plating can be performed. Furthermore, thickness of each layer largely depends on the plating time, and can be easily adjusted up to from micrometer unit to nano meter unit. The ratio between the soft metal and the hard metal of the alloy layer 32 can be arbitrarily adjusted. Preferably, the alloy layer 32 is multi-stacked in order to secure a more effective mechanical strength as shown in the drawings.

The volume occupied by the alloy layer 32 in the metal support layer 30 is not that large, because the layer is formed with thin films, which contributes very little to an entire thermal conductivity of the metal support layer 30. As a result, the thermal conductivity of the soft metal is not damaged to thereby enable to secure the desired mechanical rigidness.

As depicted in FIG. 6b, the alloy layer 32 has a multi-film stacked structure in which soft metal-rich regions 33 and hard metal-rich regions 34 are alternated. This means that the soft metals and the hard metals are not completely separated but divided according to highs and lows of relative components.

At this time, in order to arrange the multi-film stacked structure where the soft metals and the hard metals are alternatively mixed, the plating is conducted in such a manner that a pulse current is applied to the plating solution, where the pulse current is so programmed as to periodically show current peaks of the soft metals and the hard metals. This structure constitutes a kind of buffer styled one where concentration to surface area between two metals or a metal and an alloy is gradually changed such that occurrence of an inner tension between two metals each having a little different crystal lattice constant can be prevented.

Figure 7:
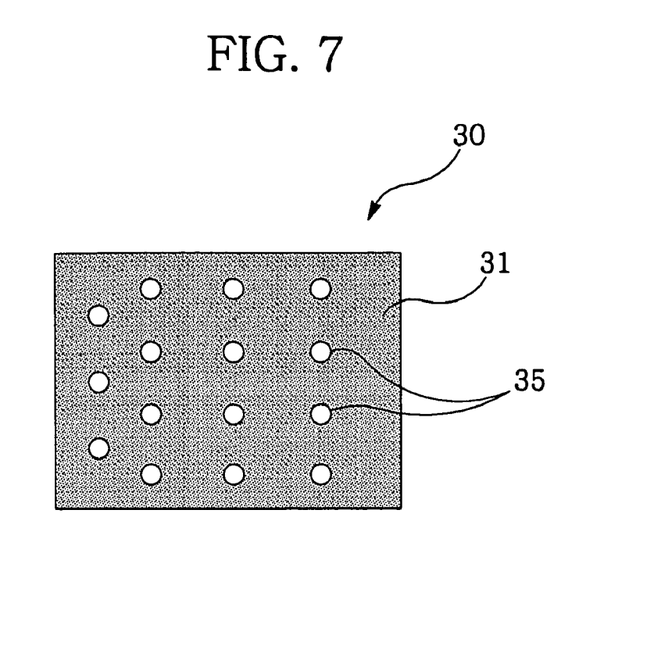
FIG. 7 is a cross-sectional view illustrating another embodiment of a metal support layer of a vertical LED according to the present invention.

FIG. 7 is a cross-sectional view illustrating another embodiment of a metal support layer of a vertical LED according to the present invention, where the metal support layer 30 is structured in such a fashion that alloy granules 35 of hard metal each having a Young's modulus higher than that of a soft metal 31 and the soft metal are mixed in the soft metal 31.

In other words, if alloy plating is performed for a short time while the soft metal is plated, it is possible to contain the alloy granules in a plating layer.

The aforementioned structures having a metal support layer 30 can be easily electrodeposited by adjusting voltages and currents in the process of electrolytic plating from a plating solution, and can be more effectively electrodeposited by adjusting suspended time of electricity supply and an agitating speed of the plating solution.

In other words, as polarization characteristic is different for each metal, kinds and amounts of electrodeposited metals can be adjusted by adjustment of currents and voltages.

As another method, the structure of a metal support layer may be formed by a composite plating method. In other words, if the alloy granules are dispersed in the plating solution of the soft metal and the soft metal is plated, the alloy granules are mixed in eutectoid structure within the soft metal. Preferably, the plating is conducted in such a manner that surface active agent is admixed and agitated for more effective composite plating.

Figure 8:
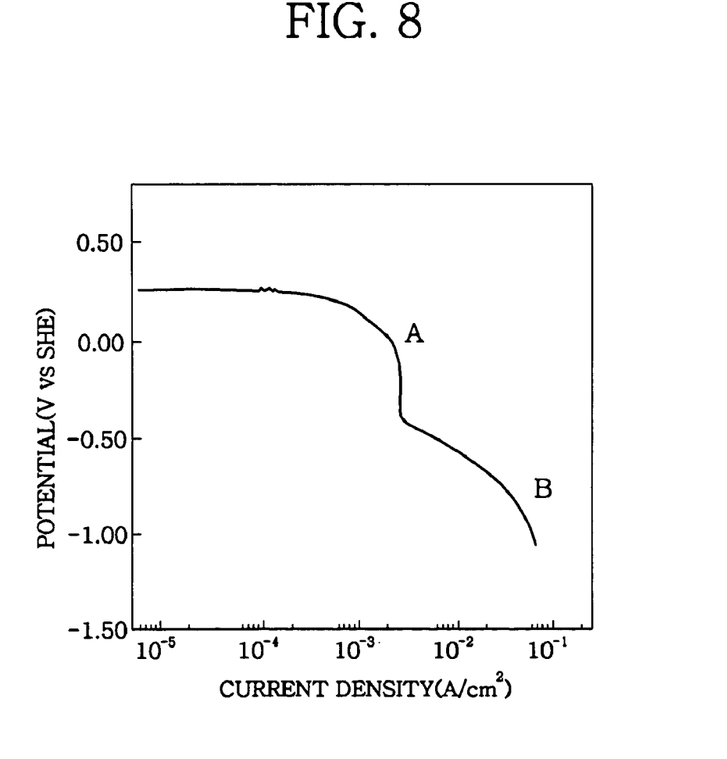
FIG. 8 is a polarization curve for electrodeposition of a metal support layer of a vertical LED according to the present invention.

FIG. 8 is a polarization curve for electrodeposition of a metal support layer of a vertical LED according to the present invention, where the polarization curve concerns electrodeposition of Cu and Ni.

According to the polarization curve, Cu is electrodeposited in A region and Ni is electrodeposited in B region, while Cu and Ni are concurrently electrodeposited at a boundary.

Furthermore, Cu content increases as the plating solution is agitated during Ni electrodeposition such that reduced agitation speed or non-agitation of the plating solution can adjust a metal composition ratio of the alloy layer, and it is preferred to have a suspended time of power supply when an electrodeposited metal is to be changed.

As apparent from the foregoing, there is an advantage in the vertical structure light emitting diode (LED) and a fabricating method thereof thus described according to the present invention in that a metal support layer is formed on an upper surface of a light emitting structure by way of electrolytic plating method in which no high temperature process is required to obviate occurrence of defects on the devices.

There is another advantage in that a metal support layer containing a soft metal and a hard metal is formed on the light emitting structure to prevent occurrence of warping of a wafer to increase the mechanical strength and to improve reliability.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A vertical structure light emitting diode (LED) comprising: a light emitting structure; and
a metal support layer formed on a surface of the light emitting structure, wherein the metal support layer includes a soft metal and a hard metal having a Young's modulus higher than that of the soft metal, and the hard metal of the metal support layer exists in the soft metal as an alloy layer state with the soft metal.

2. The LED as defined in 1, wherein the alloy layer comprises a multi-stacked layer.

3. The LED as defined in 1, wherein the metal support layer comprises a multi-stacked layer in which a soft metal layer and a hard metal layer are alternatively formed.

4. The LED as defined in claim 1, wherein a thermal conductivity of the soft metal is in the range of about 150~400 W/km.

5. The LED as defined in claim 1, wherein the soft metal and the hard metal have substantially the same crystal lattice constant.

6. The LED as defined in claim 1, wherein the soft metal is at least one of Au, Ag, Cu and Al.

7. The LED as defined in claim 1, wherein the hard metal is at least one of Ni, Co, Pt and Pd.

8. The LED as defined in claim 1, wherein the light emitting structure is stacked in sequence with a first semiconductor layer having a first polarity, an active layer and a second semiconductor layer having a reverse polarity from the first polarity.

9. The LED as defined in claim 8, wherein the first polarity of the first semiconductor layer is an N type.

10. A method of fabricating a vertical LED comprising: forming a light emitting structure on a substrate;
forming a metal support layer on a surface of the light emitting structure using an electrolytic plating process; and
removing the substrate, wherein forming the metal support layer comprises, forming alloy granules of the soft metal and the hard metal; and mixing the alloy granules with another soft metal.

11. The method as defined in claim 10, wherein the metal support layer comprises a soft metal and a hard metal having a Young's modulus higher than that of the soft metal.

12. The method as defined in claim 10, wherein forming the light emitting structure comprises forming in sequence a first semiconductor layer having a first polarity, an active layer and a second semiconductor layer having a reverse polarity from the first polarity.

13. A method of fabricating a vertical LED comprising: forming a light emitting structure on a substrate;
forming a metal support layer on a surface of the light emitting structure using an electrolytic plating process; and
removing the substrate, wherein the metal support comprises a soft metal and a hard metal having a Young's modulus higher than that of the soft metal, wherein forming the metal support layer comprises:
forming an alloy layer including the hard metal and the soft metal; and wherein the alloy layer is formed on another soft metal.

14. The method as defined in claim 13, wherein forming the alloy layer comprises alternatively forming a soft metal layer and a hard metal layer into a multi-stacked layer.

15. The method as defined in claim 11, further comprising selecting the soft metal and the hard metal to have substantially the same crystal lattice constant.

16. The method as defined in claim 10, wherein the soft metal is at least one of Au, Ag, Cu and Al, and the hard metal is at least one of Ni, Co, Pt and Pd.

17. The method as defined in claim 10, further comprising forming an electrode at another surface of the light emitting structure.

18. A vertical structure light emitting diode (LED) comprising: a light emitting structure; and a metal support layer formed on a surface of the light emitting structure, wherein the metal support layer includes a soft metal and a hard metal having a Young's modulus higher than that of the soft metal, and the metal support layer comprises alloy granules made from the hard metal and the soft metal and the alloy granules are mixed with another soft metal.

* * * * *